(12) United States Patent
Tu et al.

(10) Patent No.: US 9,416,930 B2
(45) Date of Patent: Aug. 16, 2016

(54) LED LAMP STRIP AND MANUFACTURING PROCESS THEREOF

(71) Applicant: LINGSEN PRECISION INDUSTRIES, LTD., Taichung (TW)

(72) Inventors: Ming-Te Tu, Taichung (TW); Mu-Tsan Liao, Taichung (TW)

(73) Assignee: LINGSEN PRECISON INDUSTRIES, LTD., Taichung (TW)

( * ) Notice: Subject to any disclaimer, the term of this patent is extended or adjusted under 35 U.S.C. 154(b) by 0 days.

(21) Appl. No.: 14/152,222

(22) Filed: Jan. 10, 2014

(65) Prior Publication Data

US 2014/0126209 A1 May 8, 2014

Related U.S. Application Data

(62) Division of application No. 13/109,471, filed on May 17, 2011, now Pat. No. 8,664,045.

(30) Foreign Application Priority Data

Mar. 11, 2011 (TW) .............................. 100108327 A

(51) Int. Cl.
| | |
|---|---|
| *H01L 29/88* | (2006.01) |
| *F21S 4/00* | (2016.01) |
| *F21K 99/00* | (2016.01) |
| *H01L 33/62* | (2010.01) |
| *F21Y 101/02* | (2006.01) |
| *F21Y 103/00* | (2016.01) |

(52) U.S. Cl.
CPC . *F21S 4/006* (2013.01); *F21K 9/00* (2013.01); *F21K 9/90* (2013.01); *F21S 4/20* (2016.01); *F21S 4/24* (2016.01); *F21Y 2101/02* (2013.01); *F21Y 2103/003* (2013.01); *H01L 33/62* (2013.01); *H01L 2224/48091* (2013.01)

(58) Field of Classification Search
CPC ............. F21K 9/00; F21K 9/903; F21K 9/90; H01L 33/62; H01L 2224/48091; H01L 2924/00014; H01L 3/62; F21S 4/006; F21S 4/20; F21Y 2101/02; F21Y 2103/003
USPC .......... 257/676, 666, 690, E33.066, E23.031, 257/E23.052, 88, 94–103, 723, E33.06
See application file for complete search history.

(56) References Cited

U.S. PATENT DOCUMENTS

| | | | |
|---|---|---|---|
| 3,888,745 A | 6/1975 | Hojyo et al | |
| 5,849,608 A | 12/1998 | Abe | |
| 6,788,541 B1 * | 9/2004 | Hsiung | G09F 9/33 257/713 |
| 6,936,855 B1 | 8/2005 | Harrah | |
| 7,054,161 B1 | 5/2006 | James | |
| 7,078,738 B2 * | 7/2006 | Nawashiro | H01L 25/0753 257/13 |
| 7,696,609 B2 | 4/2010 | Oyu | |
| 2003/0168720 A1 * | 9/2003 | Kamada | B29C 45/14655 257/666 |
| 2003/0189830 A1 * | 10/2003 | Sugimoto | H01L 25/0753 362/294 |
| 2005/0073846 A1 * | 4/2005 | Takine | H01L 33/64 362/296.04 |

(Continued)

*Primary Examiner* — Yosef Gebreyesus

(74) *Attorney, Agent, or Firm* — Muncy, Geissler, Olds & Lowe, P.C.

(57) ABSTRACT

A process of manufacturing an LED lamp strip includes the steps of forming a plurality of through holes on an adhesive tape, mounting the adhesive tape to a top side of a scrollable lead frame, bonding a plurality of LED chips to the top side of the scrollable lead frame according to the positions of the through holes, packaging the LED chips respectively, and finally cutting the scrollable lead frame. In light of this, the LED lamp strip can be produced under the circumstances of low production cost and less production time.

2 Claims, 5 Drawing Sheets

(56) References Cited

U.S. PATENT DOCUMENTS

| | | | |
|---|---|---|---|
| 2006/0186431 A1* | 8/2006 | Miki | H01L 33/505 257/100 |
| 2007/0228386 A1* | 10/2007 | Shie | H01L 33/486 257/79 |
| 2008/0002100 A1* | 1/2008 | Kaneko et al. | 349/65 |
| 2008/0231169 A1* | 9/2008 | Hata | H01B 1/10 313/500 |
| 2009/0001404 A1* | 1/2009 | Ohata | H01L 33/486 257/99 |
| 2009/0008756 A1 | 1/2009 | Lim et al. | |
| 2009/0079051 A1 | 3/2009 | Amano et al. | |
| 2009/0289336 A1 | 11/2009 | Meghro et al. | |
| 2010/0230692 A1* | 9/2010 | Yasuda | H01L 33/60 257/98 |
| 2011/0101410 A1* | 5/2011 | Lin | H05K 1/0204 257/99 |

* cited by examiner

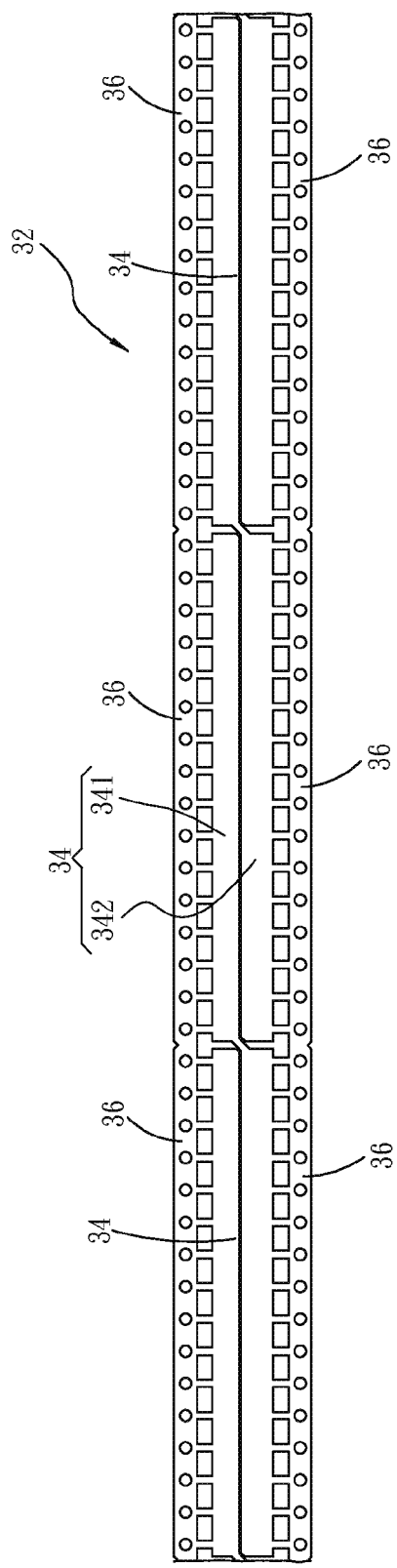
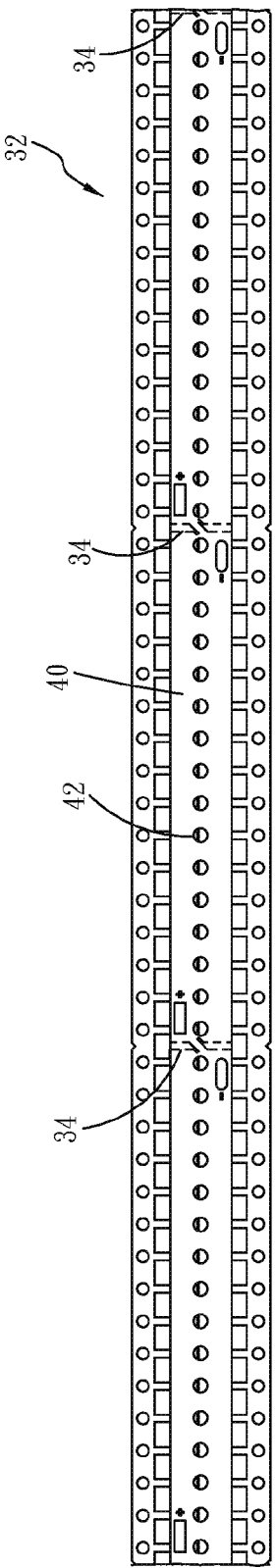
FIG. 3 A
FIG. 3 B

LED LAMP STRIP AND MANUFACTURING PROCESS THEREOF

CROSS-REFERENCE TO RELATED APPLICATIONS

This application is a Divisional of co-pending application Ser. No. 13/109,471, filed on May 17, 2011, for which priority is claimed under 35 U.S.C. §120, the entire contents of all of which are hereby incorporated by reference.

BACKGROUND OF THE INVENTION

1. Field of the Invention

The present invention relates generally to an LED (light emitting diode), and more particularly, to a process of manufacturing an LED lamp strip and the LED lamp strip.

2. Description of the Related Art

Referring to FIG. 1, in a conventional LED lamp strip 10, a plurality of LED packages 12 are mounted on the surface of a flexible circuit board 14 by surface mounted technology (SMT) and then a reflow process is applied to the flexible circuit board 14 and the LED packages 12 to allow the LED packages 12 to be securely soldered on the surface of the flexible circuit board 14. However, the high temperature resulting from the reflow process tends to bring about adverse effect on the LED packages 12.

Referring to FIG. 2, in another conventional LED lamp strip 20, a plurality of LED chips 22 are fixed on the surface of a support member 26 by an adhesive tape 24 and finally packaged separately. However, this conventional LED lamp strip 20 is formed of a plurality of the support members 26 connected with one another by soldering for required length. In this way, the production cost and time are increased.

SUMMARY OF THE INVENTION

The primary objective of the present invention is to provide an LED lamp, which can be manufactured conveniently at low cost.

The foregoing objective of the present invention is attained by the LED lamp composed of a support member, an adhesive tape, and a plurality of LED packages. The support member is a part cut from a scrollable lead frame. The adhesive tape is adhesively mounted to a top side of the support member and includes a plurality of through holes spaced from one another. Each of the LED packages extends through one of the through holes of the adhesive tape to be mounted to the top side of the support member.

The secondary objective of the present invention is to provide a manufacturing process of the LED lamp strip, which can decrease the product cost and time.

The foregoing objective of the present invention is attained by the manufacturing process of the LED lamp strip. The manufacturing process includes the steps of providing the scrollable lead frame, forming a plurality of the through holes spaced from one another on the adhesive tape, mounting the adhesive tape to a top side of the scrollable lead frame, adhesively mounting a plurality of LED chips to the top side of the scrollable lead frame according to the positions of the through holes, packaging the LED chips respectively to produce the LED packages, and finally cutting the scrollable lead frame to produce the LED lamp strip. In light of this, the present invention does not need the reflow process to avoid the high temperature of the reflow process applied to the LED packages. Besides, the lead frame can be cut as per required length to avoid multiple soldering.

DETAILED DESCRIPTION OF PREFERRED EMBODIMENTS

Figures 1, 2:
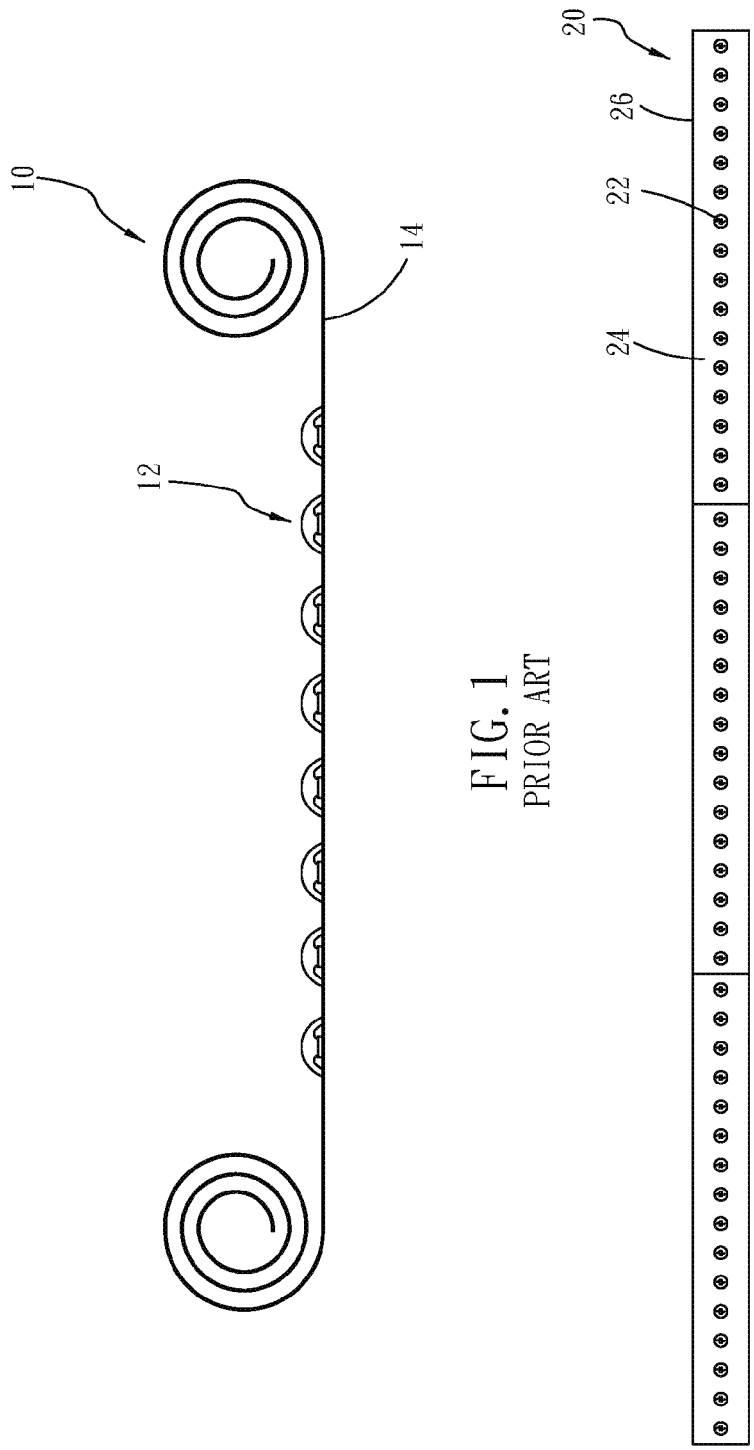
FIG. 1 is a side view of a conventional LED lamp strip.
FIG. 2 is a top view of another conventional LED lamp strip.
Figure 3C:
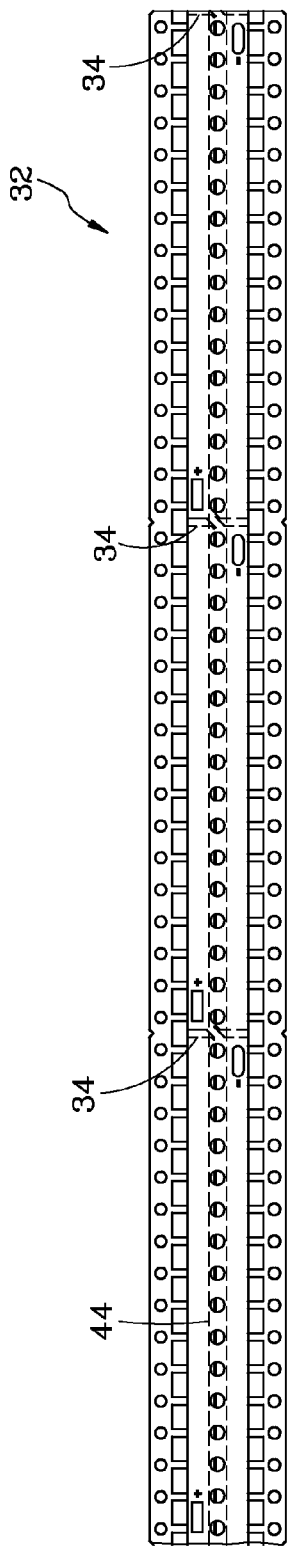
FIGS. 3A-3E are flow charts in accordance with a preferred embodiment of the present invention.
Figure 3D:
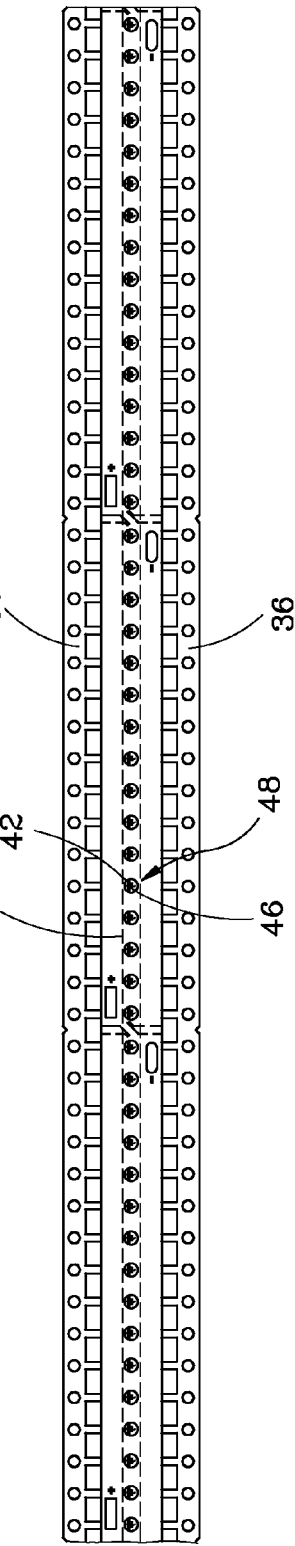
Figure 3:
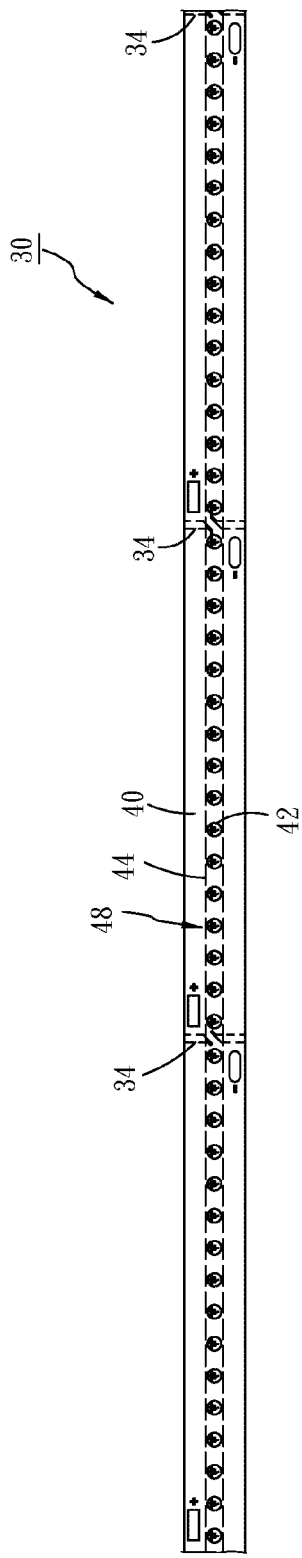
Figure 4:
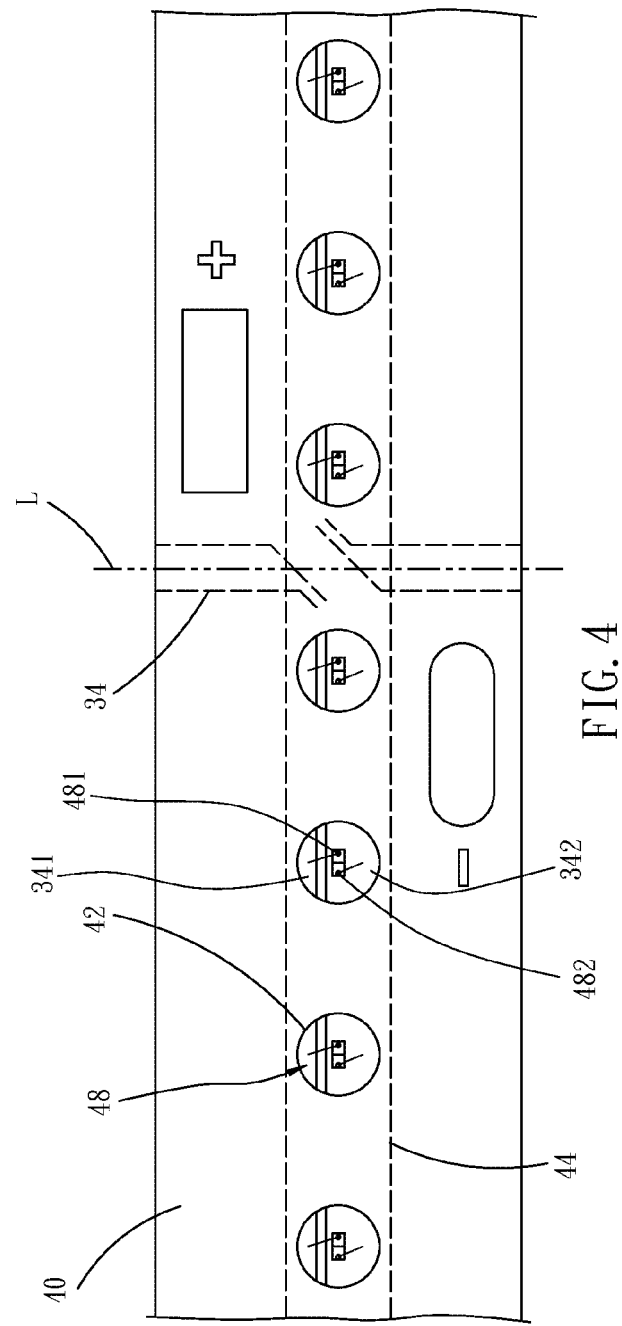
FIG. 4 is an enlarged view of a part of the preferred embodiment of the present invention.

A manufacturing process of an LED lamp strip 30 in accordance with a first preferred embodiment of the present invention includes the following steps.

a) Provide a scrollable lead frame 32 defining a plurality of interconnected support sections 34 and a plurality of interconnected crop sections 36. Each support section 34 includes a positive electrode region 341 and a negative electrode region 342. As shown in FIG. 3A, a cutting line L is located between each two of the support sections 34, which are adjacent to each other. As shown in FIG. 4, each two of the crop sections 36 are connected in pair to two sides of the support section 34 separately.

b) Form a plurality of through holes 42 spaced from one another on an upper adhesive tape 40 to mark where LED chips 46 are to be adhesively mounted and where positive and negative electrodes are to be connected. And then mount the upper adhesive tape 40 to top sides of the support sections 34, as shown in FIG. 3B. Next, mount a lower adhesive tape 44 to bottom sides of the support sections 34, as shown in FIG. 3C.

c) Bond a plurality of the LED chips 46 to the top sides of the support sections 34 according to the through holes 42 by adhesive fillers separately. The lower adhesive tape 44 can prevent the adhesive fillers from leakage. Next, package each of the LED chips 46 to produce one LED package 48. Each LED package 48 includes a first electrode 481 and a second electrode 482. The first electrode 481 and the second electrode 482 of each LED package 48 are electrically connected with the positive electrode region 41 and the negative electrode region 342.

d) cut the crop sections 36 out of the lead frame 32 to enable the support section 34 to become a support member. Next, cut the lead frame 32 along the cutting line L for a required length. In this way, the LED lamp strip 30 is completed, as shown in FIG. 3E.

Figure 5:
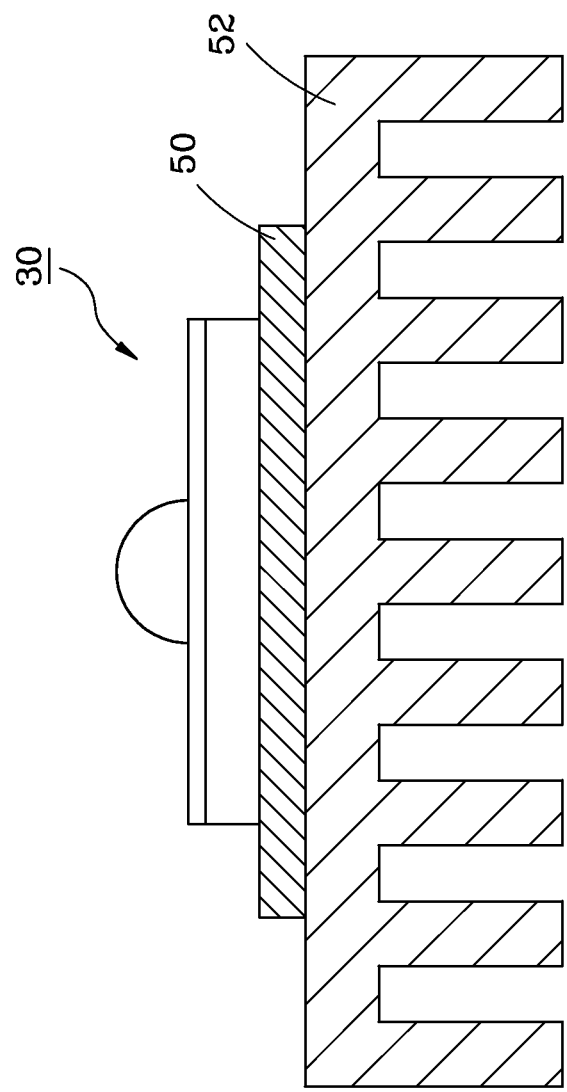
FIG. 5 is a sectional view of the preferred embodiment of the present invention, showing the assembly of the LED lamp strip.

In light of the above steps, the LED lamp strip 30 is made based on the lead frame 32, so the reflow process can be skipped to prevent the high temperature of the reflow process from affecting the LED package 48. Besides, the lead frame 32 can be cut therefrom for a part of a desired length to avoid the multiple soldering process for lower production cost and less production time. On the other hand, the LED lamp strip 30 made based on the aforesaid manufacturing process includes one of the support members (the support section 34), the upper adhesive tape 40 bonded to the top side of the support member, the lower adhesive tape 44 bonded to the bottom side of the support member, and one of the LED packages 48 mounted to the top side of the support member and located in the through hole 42 of the upper adhesive tape 40, as shown in FIG. 3E. Before the follow-up assembly procedure, an insulated thermally-conductive adhesive tape 50 is bonded to a thermally-heating member 52. Next, the LED lamp strip 30 is bonded to the insulated thermally-conductive adhesive tape 50, as shown in FIG. 5. Finally, the positive and negative electrodes are connected with each other to complete the assembly.

Although the present invention has been described with respect to a specific preferred embodiment thereof, it is in no way limited to the specifics of the illustrated structures but changes and modifications may be made within the scope of the appended claims.

What is claimed is:

1. A light-emitting diode (LED) lamp strip, comprising:
   a support member, the support member having a positive electrode region and a negative electrode region;
   an adhesive tape adhesively mounted to a top side of the support member and having a plurality of through holes spaced from one another; a second adhesive tape adhesively mounted to a bottom side of the support member;
   a plurality of LED packages mounted to the negative electrode region of the support member through the through holes, the plurality of LED packages each having a first electrode and a second electrode, the first electrode of each LED package being electrically connected with the positive electrode region and the second electrode of each LED package being electrically connected with the negative electrode region.

2. The LED lamp strip as defined in claim 1, wherein the support member is a part cut out of a lead frame.

* * * * *